United States Patent [19]

Hatch et al.

[11] Patent Number: 4,929,370

[45] Date of Patent: May 29, 1990

[54] DRY LUBRICANT DRILLING OF THRU-HOLES IN PRINTED CIRCUIT BOARDS

[75] Inventors: William R. Hatch, Diamond Bar, Calif.; John W. Foster, Edina, Minn.

[73] Assignee: Lubra Sheet Corporation, Eden Prairie, Minn.

[21] Appl. No.: 390,496

[22] Filed: Aug. 1, 1989

Related U.S. Application Data

[60] Continuation of Ser. No. 227,687, Sep. 30, 1988, abandoned, which is a division of Ser. No. 919,085, Oct. 14, 1986, Pat. No. 4,781,495.

[51] Int. Cl.$^5$ .................. B23B 51/06; B23B 35/00
[52] U.S. Cl. .................... 252/12.2; 408/1 R
[58] Field of Search .............. 408/1 R, 56, 60, 61, 408/704; 264/154, 155, 156; 407/11; 29/527.4, 458; 427/96, 289; 72/42; 252/12, 12.2

[56] References Cited

U.S. PATENT DOCUMENTS

| | | | |
|---|---|---|---|
| 2,947,206 | 8/1960 | Flanagan | 408/56 |
| 3,568,486 | 3/1971 | Rosenberg et al. | 72/42 |
| 3,977,075 | 8/1976 | Lynch et al. | 228/180 A |
| 4,116,872 | 9/1978 | Jahnke | 72/42 |
| 4,183,137 | 1/1980 | Lomerson | 427/11 |
| 4,316,322 | 2/1982 | Tranberg | 29/852 |
| 4,383,785 | 5/1983 | Rice | 408/1 R |
| 4,477,512 | 10/1984 | Thomas et al. | 428/236 |
| 4,501,787 | 2/1985 | Marchetti et al. | 428/236 |
| 4,519,732 | 5/1985 | Sutcliffe | 408/1 R |
| 4,597,988 | 7/1986 | Kukanskis et al. | 427/97 |
| 4,599,134 | 7/1986 | Babu et al. | 156/626 |
| 4,689,897 | 7/1987 | Daniels et al. | 408/1 R |

Primary Examiner—Neil Abrams
Attorney, Agent, or Firm—Christie, Parker & Hale

[57] ABSTRACT

Thru-holes are drilled in a printed circuit board panel having alternating dielectric layers and electrically conductive layers. A water soluble dry film lubricant sheet is placed adjacent an electrically conductive outer layer of the panel prior to drilling thru-holes through the panel with a rotary drill. The drill surface is lubricated while forming a clean thru-hole from contact between the drill and the lubricant. The dry film lubricant generally may comprise a water soluble lubricant hardened to a solid or semi-solid dry film-form and impregnated in a carrier such as a porous paper sheet. In one embodiment, the dry film lubricant includes a water soluble lubricant such as dipropylene glycol, a non-ionic surfactant, and a wax-like hardener. Following drilling of the thru-holes, the dry film lubricant sheet is removed, and the thru-holes can be rinsed in an aqueous alkaline solution. The thru-holes are then plated with an electrically conductive metal for forming electrical contacts between the metalized thru-holes and the electrically conductive layers of the panel. The dry film lubricant extends drill life and produces a clean thru-hole that prevents epoxy smear and avoids the prior art use of harsh chemical treatment following drilling to otherwise remove dielectric smear or fibers that might extend into the thru-hole and disrupt the continuity of the later-formed electrical contact.

10 Claims, 3 Drawing Sheets

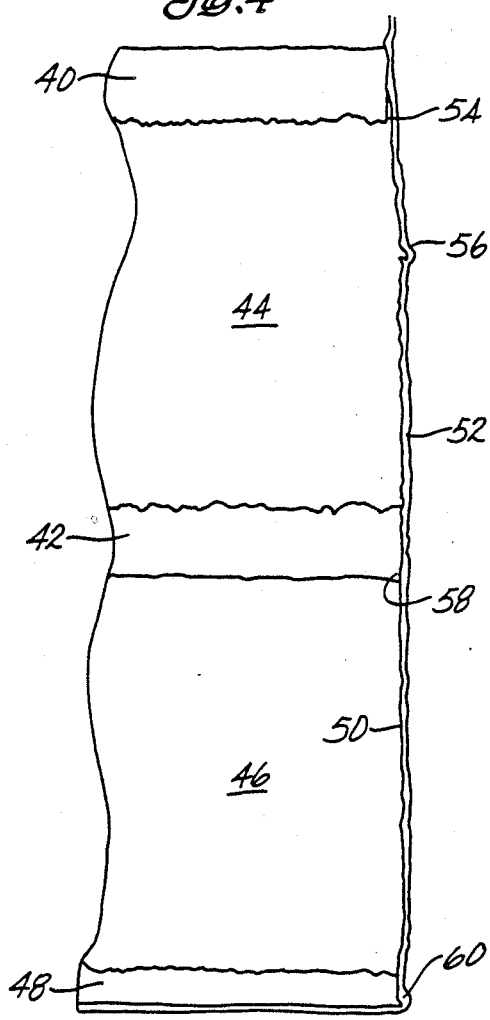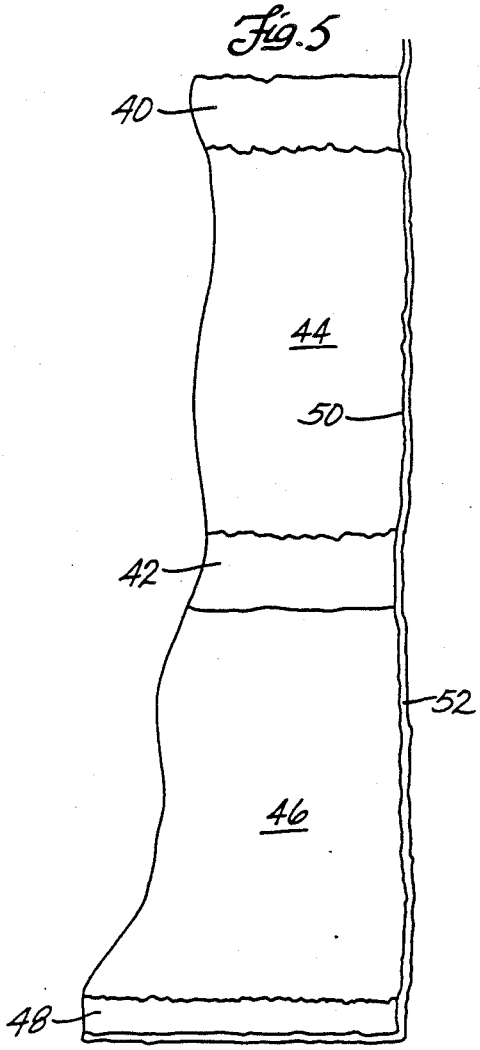

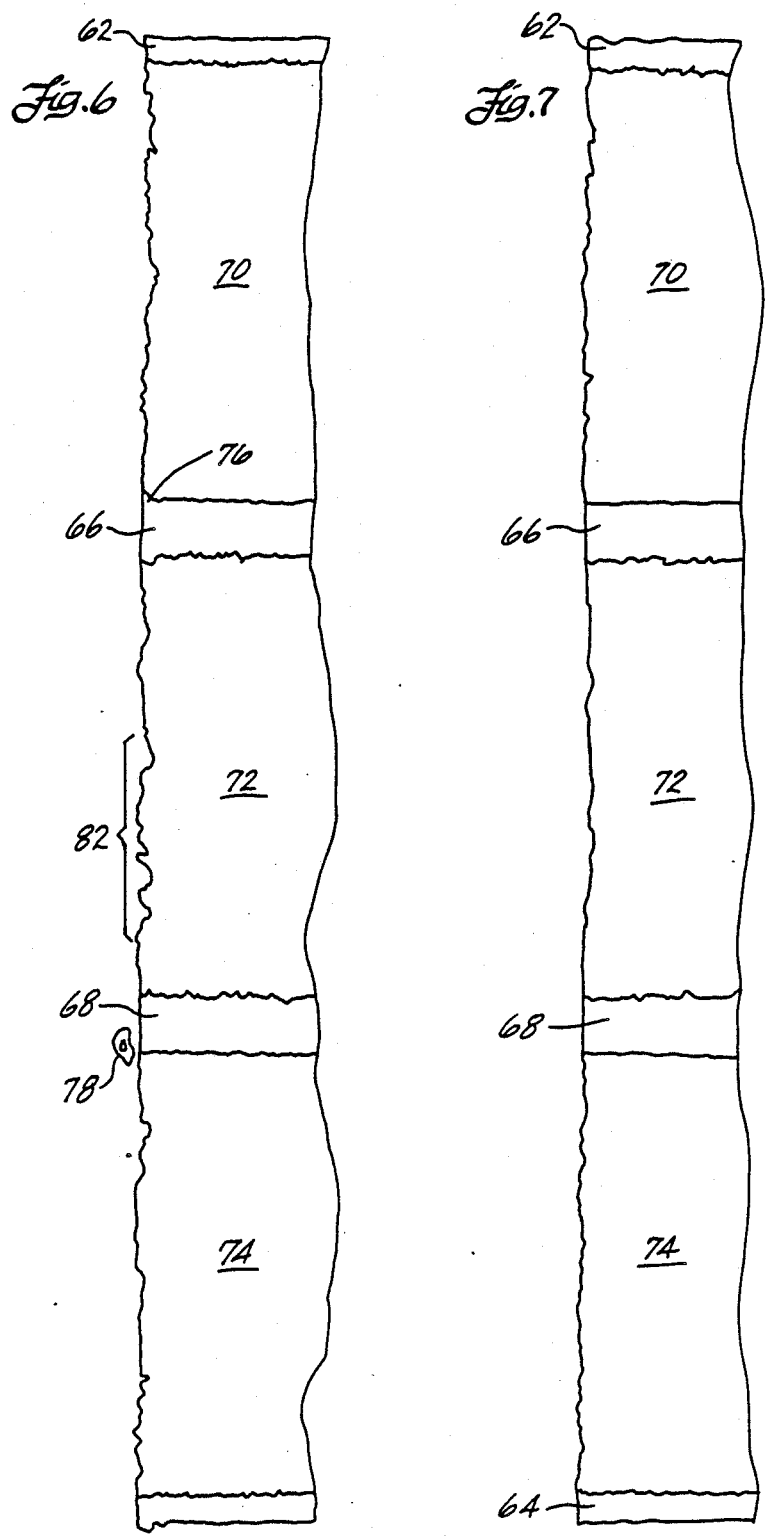

DRY LUBRICANT DRILLING OF THRU-HOLES IN PRINTED CIRCUIT BOARDS

This is a continuation of application Ser. No. 227,687, filed Sept. 30, 1988, now abandoned, which is a division of application Ser. No. 919,085, filed Oct. 14, 1986 now U.S. Pat. No. 4,781,495.

FIELD OF THE INVENTION

This invention relates to a process for drilling thru-holes in printed circuit board panels, especially those panels made from an electrically conductive metal layer adjacent an electrically insulating layer made from a dielectric material. These circuit board panels are often manufactured as multi-layer panels having dielectric layers made of epoxy-glass resin separating inner and outer conductive layers made of copper. More particularly, the invention relates to an improved drilling process which results in reduced or eliminated dielectric smear, reduced abrasion to the drilling tool, better electrical contact between the conductive layers of the panel, reduced time and expense in carrying out the drilling process, and many other improvements.

BACKGROUND OF THE INVENTION

The present invention is applicable to drilling thru-holes in printed circuit board panels having at least an electrically conductive layer adjacent an electrically insulating layer, also referred to in the art as a dielectric layer. In drilling thru-holes in such printed circuit board panels, the rotary drill often smears the dielectric material onto the conductive metal portion of the hole wall. This creates many problems to which the present invention is addressed. In the description to follow, the invention is described in the context of drilling thru-holes in multi-layer printed circuit board panels having conductive metal layers separated by epoxy-glass dielectric layers; although it is recognized that the invention is applicable to the drilling of thru-holes in printed circuit board panels having other structural configurations and layers made from other materials.

Multi-layer printed circuit board panels, for example, typically include, in a cross-section, a copper outer layer, followed by an epoxy-glass resin layer, a copper inner layer, another epoxy-glass resin layer, and an outer copper layer. The number of alternating copper inner layers and epoxy-glass resin layers can vary. In some panels, the copper inner layer may not be used. In other applications, the dielectric layer may be made from a material other than epoxy-glass resin.

Multi-layer printed circuit board panels are made by a multi-stage process. Once the circuit pattern is etched on each copper inner layer, the inner layer or layers are sandwiched between the epoxy layers and the copper outer layers, and heat and pressure are then applied to cure the epoxy and bond the layers together. A large number of tiny thru-holes are then drilled through the cross-section of the multi-layer panel by a high speed drill, in preparation for forming electrical contacts between the top and bottom outer layers. Usually, the contacts are made by first plating an electrically conductive metal, such as electroless copper, to the surface of the thru-hole. The wall of the thru-hole is then further plated with electrolytic copper to complete the contact. It is not uncommon to drill thousands of thru-holes in a single printed circuit board panel. As a result, abrasion to the drill bit is a problem because of the high drilling speed and the large amount of heat generated, especially because of drilling through the metal layers and the abrasive epoxy-glass layers. For instance, the drilling tool can easily reach temperatures in the neighborhood of 500° F. to 700° F., and it is believed that temperatures at the tip of the drilling tool can be in excess of 1,000° F. Drill speed can be sixty thousand rpm or higher.

Drilling thru-holes in the epoxy-glass and copper layers often causes the epoxy to smear over the copper inner layers. The dielectric material also can smear onto the conductive layers when drilling in panels having insulating layers made from other materials. If the thru-holes are left untreated (i.e., if the smeared dielectric material is not completely removed) prior to copper plating the walls of the thru-holes, a dielectric barrier can be left between the conductive path of the copper plated thru-holes and the copper conductive layers. This interferes with the electrical connection and results in unreliable electrical contacts between the copper inner and outer layers (or between the conductive outer layers if an inner layer is not used). Accordingly, it has become a common practice to remove the epoxy smear, or other dielectric smear, before metalizing the thru-holes. (For simplicity, the dielectric smear and its associated problems are described below in relation to the known methods of treating epoxy smear.)

The prior art has disclosed a variety of techniques for removing epoxy smear, including mechanical means for abrading or physically removing the smear and chemical processes for dissolving it. Chemical processes are most commonly used. They typically comprise a multi-step process of first using highly concentrated sulfuric acid or chromic acid solutions to dissolve the epoxy resin smear. The panel then must be rinsed further to removed chemical byproducts of the epoxy smear and acid treatment. Rinsing in sulfuric acid can leave sulfonated epoxy residue on the walls of the drill holes. This can break down the integrity of the wall and require further rinsing to remove the sulfonated breakdown byproducts. If the panel is rinsed in water to remove the sulfuric acid, some of this smear can come out of solution and precipitate back on the walls of the thru-holes. Thus, various other chemicals are used for removing this precipitate which can otherwise prevent reliable electrical contacts being made between the copper layers. Neutralizers or other cleaning solutions also are commonly used in further treatment steps after acid treatment to remove epoxy smear. In addition to acid treatment, other chemical agents, such as etching solutions, are used to remove protruding glass fibers from the epoxy-glass layers. Glass fibers protruding into the thru-holes may cause misplating or result in uneven metal coverage. Further, a condition known as "pink ring" also occurs in the acid treatment of epoxy smear. Pink ring is caused by an etchback into the oxide layer at the interface between the copper layer and the dielectric layer. This leaves a void surrounding the drill hole which can interfere with contact between the hole wall and the plated copper layer.

Use of corrosive chemicals, such as concentrated sulfuric acid, chromic acid, hydrofluoric acid, and the like, has not been an acceptable solution to the problem of drilling high quality thru-holes that can be plated to make reliable contacts. These chemicals are highly concentrated (98% sulfuric acid is commonly used, for example). In addition to leaving residues that require further removal from the circuit board, the entire chemical treatment process is costly and creates disposal hazards as well. Some commonly used disposal practices are no longer permissible under new governmental regulations.

In the past, mechanical techniques used for drilling multi-layer printed circuit boards have included attempts to vary the speed of the drill to achieve entry and exit speeds that may improve the integrity of drilling through the epoxy layers. However, this approach has been unsuccessful because, as the drill heats up, the epoxy sticks to it and consequently sticks to the copper as the drill passes through the conductive layers. This also causes rough holes and leaves glass fibers protruding from the holes, and such fibers must be subsequently removed by etching or similar chemical treatment.

The present invention provides a novel approach to the process of drilling thru-holes in circuit board panels in which there is a tendency for the rotary drill to smear dielectric material on the surfaces of conductive layers penetrated by the drilled thru-hole. The invention has the unique advantage of extending drill life while at the same time essentially eliminating dielectric smear. This, in turn, reduces the need for further chemical treatment steps and eliminates treatment with harsh chemicals and the resultant toxic waste disposal problems. The invention also provides improved coverage of the metal deposited on the thru-hole surfaces when later forming the electrical contacts between the copper layers.

SUMMARY OF THE INVENTION

Briefly, this invention relates to a process for drilling thru-holes in a printed circuit board panel so that a dielectric material is not smeared onto other portions of the circuit board panel by the drilling tool. The process of this invention includes the steps of placing a water soluble dry film lubricant adjacent the panel and drilling a thru-hole through the dry lubricant film and the panel. After the thru-hole is drilled, the thru-hole is plated with a conductive material for providing electrical contact between electrically conductive layers of the circuit board panel. The dry lubricant adheres to the drill surface and the lubricity transferred to the drilling tool from the lubricant produces a smooth-walled drill hole and essentially eliminates dielectric smear on the electrically conductive layer. This eliminates the need for treatment of the smear with harsh or hazardous chemicals. The lubricity transferred to the drilling tool also reduces abrasion to the drilling tool, which extends drill life and can increase drilling production rates. Many other advantages, described below, also are produced by the dry film lubricant drilling process.

In one embodiment of the invention, the dry film lubricant comprises a water soluble lubricant hardened into a solid or semi-solid film form sufficiently dry to adhere to a carrier sheet in a stable form and act as a lubricant for a high speed rotary drill passing through the sheet, without adversely affecting drill operation or the smoothness of the resulting drill hole. In one embodiment, the dry film lubricant is impregnated in a porous paper sheet to serve as a lubricant-absorbing carrier useful in the drilling operation.

These and other aspects of the invention will be more fully understood by referring to the following detailed description and the accompanying drawings.

BRIEF DESCRIPTION OF THE DRAWINGS

FIG. 4 illustrates a photomicrograph from a first test sample showing the surface of a thru-hole drilled in a printed circuit board according to a prior art technique.

FIG. 5 illustrates a photomicrograph from a first test sample showing the surface of a thru-hole drilled in a printed circuit board by the process of this invention.

FIG. 6 illustrates a photomicrograph from a second test sample showing the surface of a thru-hole drilled in a printed circuit board by a prior art technique.

FIG. 7 illustrates a photomicrograph from a second test sample showing the surface of a thru-hole drilled in a printed circuit board by the process of this invention.

DETAILED DESCRIPTION

Figure 1:
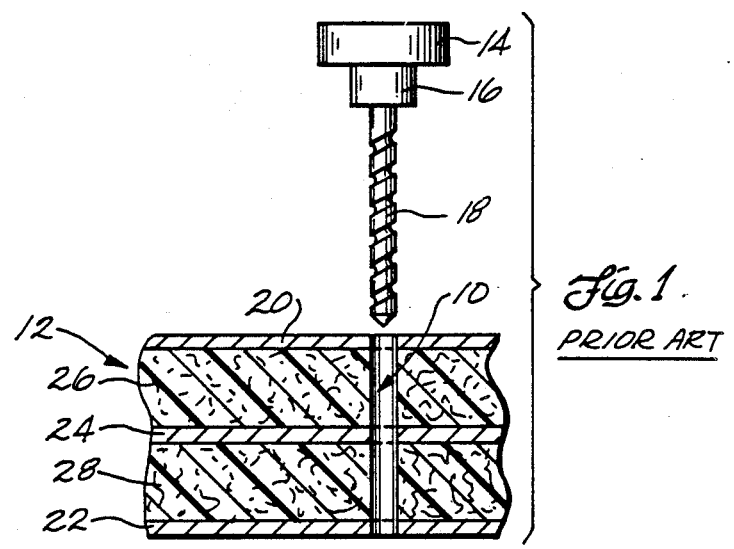
FIG. 1 is a schematic fragmentary cross-sectional view illustrating a prior art process for drilling a thru-hole in a printed circuit board substrate.

FIG. 1 schematically illustrates a prior art procedure for drilling a thru-hole 10 in a printed circuit board panel 12. A rotary drill motor 14 has a chuck 16 for securing an elongated drilling tool 18 to the motor. The printed circuit board 12 can comprise a number of conductive metal layers separated by electrically insulating or dielectric layers; and in the illustrated embodiment, a simplified multi-layer printed circuit board panel is depicted. In this embodiment, the panel includes an upper conductive metal layer 20, a lower conductive metal layer 22, a central conductive metal inner layer 24 spaced between the upper and lower layers, a first electrically insulating layer 26 bonded between the upper layer 20 and the inner layer 24 for electrically insulating the upper and inner layers, and a second electrically insulating layer 28 bonded between the electrically conductive inner layer 24 and the lower conductive layer 22 for electrically insulating the inner and lower layers. In a common practice of manufacturing such printed circuit board panels, the conductive metal layers 20, 22 and 24 are made of copper. The electrically insulating or dielectric layers 26 and 28 can comprise fiberglass bonded by an epoxy resin (referred herein as "epoxy-glass layers"). Other dielectric materials such as polyamide, phenolic, paper, ceramics, and the like, also can be used. The invention is especially useful in reducing or eliminating smearing of the dielectric material onto the face of the conductive metal layers where the drill hole wall intersects the conductive layers. This is particularly a problem with dielectric layers made of epoxy-glass resin; and therefore, the preferred embodiment is described below with reference to the problems associated with epoxy-glass dielectric materials.

During the process of drilling the thru-hole, heat is generated to such an extent that resin from the epoxy-glass layer melts and is carried by the bit around the surface of the hole, which produces smears of the insulation or other debris along the surfaces of the conductive metal layers. Epoxy smear of this type can interfere with electrical connections between the conductive metal layers and an electrically conductive surface applied to the thru-hole by metal plating techniques. Alternatively, an electrical pin (not shown) may be later inserted in the thru-hole to provide an electrical connection between the electrically conductive layers. In this instance, epoxy smear also can interfere with a complete electrical connection between the electrical layers and the pin. Thus, it is a common prior art step in the manufacturing procedure for such printed circuit boards to remove the epoxy smear by various techniques, some of which have been described in detail above.

Figure 2:
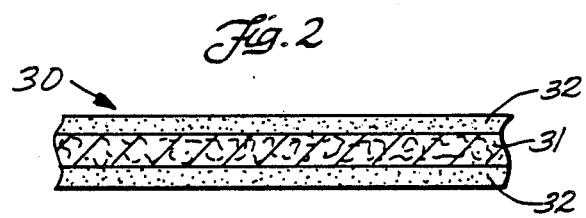
FIG. 2 is a schematic fragmentary cross-sectional view illustrating a dry film lubricant sheet used in a process for drilling thru-holes in a printed circuit board substrate according to principles of this invention.

The present invention provides a process for drilling thru-holes in such printed circuit boards by the use of a water soluble dry film lubricant incorporated into the drilling process. FIG. 2 illustrates one embodiment of the lubricant in the form of a lubricating sheet 30 which has been impregnated with a water soluble dry film lubricant. The lubricating sheet includes a thin, flat carrier sheet 31 having its opposite faces coated with a water soluble dry lubricating film 32 according to principles of this invention. The carrier sheet is preferably a porous water-dissolvable paper sheet. The dry film lubricant is absorbed into the pores of the paper sheet as well as coating the faces of the sheet as a thin film.

In one embodiment, the dry film lubricant comprises a water soluble lubricant component to which can be added a hardener for forming a dry water soluble lubricating film. The formulation also can include a material for improving the ability of the lubricant and hardener to mix together and form a stable lubricating film. The lubricant is preferably any water soluble material having lubricating properties and which can be combined with a hardener capable of drying the lubricant to a solid or semi-solid film-form, resulting in a dry lubricating film which is (1) water soluble, (2) capable of providing a stable film-form lubricant on a carrier sheet or other surface, and (3) capable of transferring to and lubricating a high speed rotary drilling tool during drilling without adversely affecting drill operation while producing a smooth-walled drill hole. A presently preferred form of the invention comprises a mixture of a liquid-form water soluble lubricant; a water soluble wax of moderate melting point, preferably a non-ionic surfactant having lubricating properties; and a wax-like hardener. In one embodiment, the water soluble wax has a melting temperature of about 60° F. to about 65° F. The wax-like component (surfactant) comprises a majority of the lubricant mixture on a weight basis. This principal component acts as a vehicle for the wax-like hardener and the lubricant, by reducing interfacial tensions between the liquid-form lubricant and the solid-form hardener. It also controls the melting temperature of the solid or semi-solid lubricating film. The lubricating component is preferably a glycol such as dipropylene glycol, a water soluble material having good lubricating properties. Diethylene glycol also may be used. The hardener can be a synthetic wax such as a fatty acid ester used in the formulation so as to provide dimensional stability without adversely affecting the desired water soluble properties of the final composition. The melting point of the finished dry or semi-dry lubricating film is preferably well below the normal operating temperature of the drilling tool so that the lubricating film will liquify under contact with the higher temperature rotary drilling tool to coat the tool with a lubricating film during use.

Generally, the components of the lubricant are first mixed from either a hardened or liquid-form into a single liquid compound by application of heat. The mixture then cools back to form a solid substance. At this point, the hardened lubricating composition can be stored for future use in its hardened condition, or it may be heated to its melting point and used to coat the opposite faces of the carrier sheet. In a preferred form of the invention, the carrier comprises any suitable type of commercially available porous water dissolvable paper, although in certain instances a nondissolvable paper sheet may be used.

According to one technique for making the dry film lubricant, the components of the formulation (lubricant and hardener, for example) are mixed and, preferably through the application of heat, are formed into a homogeneous liquid-form lubricant. The lubricant is then applied to the carrier, such as a water soluble or non-water soluble paper sheet, by running the paper through the hot lubricant to saturate the paper with the lubricant. The saturated paper is then passed over rollers or rubber squeegees to control the thickness of the film on both surfaces of the paper. The resulting sheet is then run over a cooling region which may have either cold air knives or cool roller devices to rapidly cool the lubricant and harden it. The resulting dry film lubricant sheet is then slip-sheet with one or two mil poly sheets and then rolled up for later use. The thickness of the paper sheet can be from about 0.001 to about 0.020 inch thick, and the surface thickness of the lubricating film on the paper sheet can be from about 0.001 up to about 0.015 inch. As an alternative, the dry film lubricant sheet can be cut into separate sheets which are then slip-sheeted and stacked. As a further alternative, the homogenous liquid lubricating composition can be formed into an extrudable mass which then can be extruded as a film onto a suitable carrier sheet.

Figure 3:
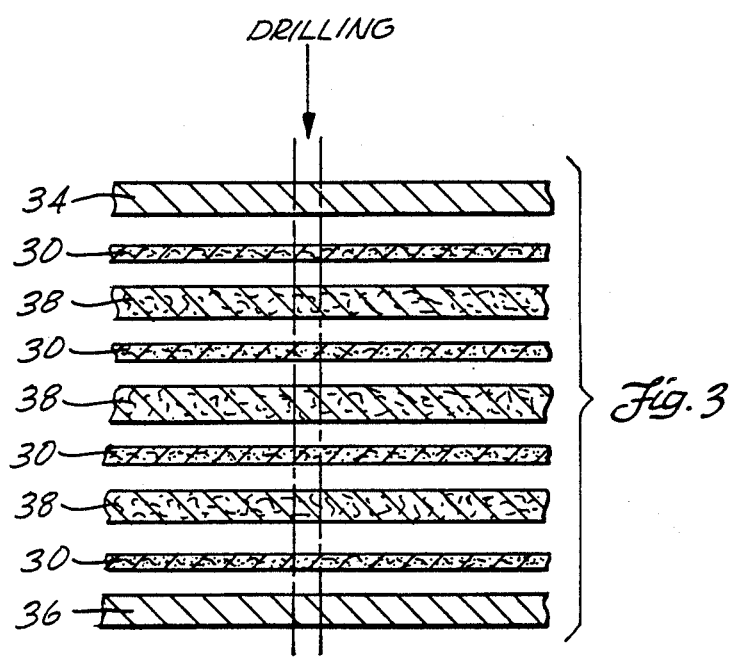
FIG. 3 is a schematic fragmentary cross-sectional exploded view illustrating components of a process for drilling thru-holes in a printed circuit board substrate according to this invention.

FIG. 3 illustrates one embodiment of a process for dry film lubricant drilling of printed circuit board panels according to this invention. In the conventional practice of drilling thru-holes in printed circuit board panels, a number of individual panels are stacked above one another between an entry sheet 34 of material above the stack and a sheet 36 of exit material at the bottom of the stack. FIG. 3 illustrates a process for drilling printed circuit board panels 38 stacked three high, which is a common practice in the art. The printed circuit board panels 38 can be any conventional type of printed circuit board panel, such as the well known copper clad panels. These panels are clad with copper on both sides with an insulating layer, such as an epoxy-glass resin, between the conductive metal layers. If the panels comprise multi-layer panels, they can have one or more copper inner layers as well, and all copper layers are separated by intervening insulating or dielectric layers, usually the epoxy-glass resin material. The entry and exit material for the sheets 34 and 36 is typically some type of paper base or thin metal sheet such as aluminum. According to this invention, the dry film lubricant sheets 30 are inserted into the stack above each of the copper clad panels 38. The embodiment of FIG. 3 also illustrates use of a fourth lubricating sheet between the bottom panel and the sheet 36 of exit material, although use of the lubricating sheet in this position of the stack is believed to be optional. Moreover, it is also believed that in a stack of panels three high or more, the dry film lubricating sheets also may be eliminated above one or more of the lowermost panels in the stack as long as sufficient lubricating properties are provided by the upper lubricating sheets in the stack. A high speed rotary drill, such as the drill 18 illustrated in FIG. 1, is operated to drill thru-holes in the stack of panels. The drilling tool first passes through the uppermost lubricating film sheet 30 and then through the first panel 38, and so on, alternately passing through a lubricating sheet and then through a printed circuit board panel. Multiple drill holes are rapidly drilled in the stacked panels using the same drill; and for each thru-hole being drilled, the drill alternately first passes through the dry film lubricating sheet and then through the circuit board panel. As the rotary drill passes through the dry film lubricant sheet, the lubricant is transferred from the sheet to the exterior surface of the drill. This transfer of lubricant is from penetration not only through the upper and lower films 32 on the sheet, but also through the porous absorbent carrier 31 which has been impregnated with the lubricant as well. Transfer of the lubricant to the drilling tool is assisted by the heat generated during drilling. The melting point of the film is controlled so that the heat generated by the higher temperature drilling tool liquifies the lubricating film when the drilling tool penetrates the film to coat the tool with the lubricating film. The lubricant on the drilling tool surface provides lubricating properties as the drill hole is being formed, producing a hole wall which is substantially smoother than a corresponding drill hole formed without such dry film lubricant contact. This, for example, is a significant advantage over spraying a liquid lubricating material directly onto the drilling tool before the tool is used to drill the thru-holes. Other advantages of the process also are described in more detail below.

Other embodiments of the dry film lubricant also can be used in the drilling process. They can include mixing the lubricant with cellulose and extruding it as a cellulosic film, or forming the lubricant as a spray or paste. The film can be coated onto a sheet of entry material, such as the sheet 34 described above, in which case the dry film lubricating sheets 30 may or may not be used in the drilling process, depending upon the level of lubricity achieved with the entry sheet. As a further alternative, the dry lubricating film can be coated ont the exterior of the circuit board panel itself, by roller coating, extrusion, spraying, dipping, or other coating techniques. In this instance, the dry film lubricating sheets 30 may or may not be used, again, depending upon the amount of lubricity transferred to the drilling tool.

Following drilling of the drill holes, the printed circuit board can be rinsed in water to dissolve and remove any water soluble dry film lubricant that may be present in the drill holes. Preferably, a water dissolvable paper sheet is used as a carrier for the dry film lubricant so that any cellulosic debris that may be present in the drill hole at microscopic levels can be dissolved and rinsed away by water. In certain instances where drill holes may be of relatively small diameter, and therefore, where a stronger rinsing solution may be necessary to thoroughly clean the drill holes, a mild alkaline aqueous solution can be used for rinsing the panel. Preferably, an alkaline solution with a pH from about 11 to 12 can be useful to solubilize any paper fibers that may be left in the drill hole from the drilling process. Rinsing in an alkaline solution does not create environmental problems otherwise created by the use of harsh chemicals, such as the concentrated acids used with prior art techniques for rinsing drill holes in printed circuit boards.

EXAMPLE

In one embodiment of the invention, a dry film lubricant is prepared by mixing glycol, preferably dipropylene glycol; a non-ionic surfactant; and a wax-like hardener. A useful combination of components in the formulation comprises about 5% to about 75% glycol, preferably dipropylene glycol; about 35% to about 85% surfactant; and about 1% to about 15% hardener. These components are mixed together and, through the application of heat, are formed into a homogenous liquid solution which can then cool back to room temperature to form a solid or semi-solid lubricating film. In one test of the dry film lubricant, an electrical printed circuit board was drilled using a dry film lubricant prepared from a mixture of the following components:

| | |
|---|---|
| dipropylene glycol | 250 ml |
| non-ionic surfactant | 670 ml |
| hardener | 80 ml |

The surfactant comprises PEG-200 trihydroxystearin, a water soluble wax of moderate melting point for providing lubricating properties to the mixture along with the glycol. Alternatively, a non-ionic surfactant, such as Surfacol 590, manufactured by Cas Cem, also can be used. The hardener comprised Paricin 13, a fatty acid ester, also manufactured by Cas Cem. Alternatively, a synthetic wax also could be used as the hardener to the extent that the water soluble properties of the final dry film lubricant are not disrupted. The trihydroxystearin was heated to 54° C. and the glycol was then added, after which the temperature of the mixture was raised to 62° C. and the ester was added. This mixture was then reduced to a temperature of 56° C. The glycol provided lubricating properties as well as acting as a binder and carrier, reducing interfacial tensions between the glycol and the solid-form hardener. The trihydroxystearin was used to impart lubricity to the final lubricating film as well as providing a cooling effect on a rotary drill tool when used in the drilling process. It also keeps the mixture biodegradable and nonhazardous. The ester is used as the principal hardener and also acts as a lubricating agent. The mixture was coated onto sheets of a pulp-base paper, preferably a water dissolvable paper sheet, 12"×17"×6 mils thick. The mixture was coated onto the paper by means of a roller, after which the paper was saturated along with leaving approximately 4-5 mils thick film of the lubricating material on one side of the paper. Once the lubricating film dried to a solid film thickness, the sheets were slip sheeted with polyethylene to separate them. A test was then conducted on a computerized four-station high speed drilling machine. Thru-holes were drilled in a six-layer printed circuit board panel consisting of two outer layers of 1-oz. copper and four inner layers of 1-oz. copper foil. The layers of copper were separated by epoxy-glass resin to form a dielectric with a thickness of about 5 mils between each copper layer. Two stations of the computer-controlled drill were used. One station was used to drill thru-holes in a control stack of panels, three panels high. The other station was used to drill thru-holes in a stack of panels, three panels high, in which the dry film lubricating sheet was placed above the first panel and below it, between the second and third panel, and between the third panel and a sheet of backup material at the bottom of the stack. Both sets of drills were new and comprised drill sizes No. 57 (0.043" diameter) and No. 70 (0.028" diameter). Spindle runout on the drill was within 0.0005". Multiple thru-holes were drilled in the same pattern for each printed circuit board stack. The reading on the computer for the No. 70 drills was:

| Stroke height | 0.700" |
|---|---|
| Depth | 0.305" |
| Feed | 120 |
| Speed | 60,000 rpm |

Normally, drills are changed after 1,000 hits. After 1,000 hits, the drill on the control stack started to show wear. The drill on the lubricated stack did not appear to show any wear until after 3,000 hits. The computer reading for the No. 57 drills was:

| Stroke height | 0.700" |
|---|---|
| Depth | 0.305" |
| Feed | 115 |
| Speed | 48,900 rpm |

The same number of drill holes were drilled with the No. 57 drills. The control stack showed drill wear after 1,000 hits, and the drill for the lubricated stack showed no wear until after about 3,000 hits.

The two bottom panels from each station were then run through electroless copper plating and then copper plated electrolytically with no desmear or etchback treatment before plating. Panels were then cross-sectioned and polished. Samples of panels from each station of both drill numbers were then closely examined. The control panels after 1,000 hits exhibited glass fibers protruding in some hole walls, very rough sides on holes on epoxy glass and uneven plating, and very noticeable epoxy smear on the inner copper layers. The lubricated panels after 2,000 hits exhibited no fibers protruding from the hole walls, extremely smooth hole walls and very even plating, and no epoxy smear on the inner or outer copper layers.

FIGS. 4 through 7 depict photomicrographs taken from regions of printed circuit boards drilled according to the test procedures described above. FIG. 4 illustrates a photomicrograph of a hole wall in a board drilled without the lubricating film, while FIG. 5 illustrates a hole wall drilled in accordance with the same procedure except that drilling was with the lubricating sheets inserted into the stack. In FIGS. 4 and 5, only the lower cross-sectional portions of the drilled panels are shown. These portions of the panels include copper inner layers 40 and 42 vertically spaced apart adjacent intervening epoxy-glass insulating layers 44 and 46, and a copper outer layer 48 at the bottom of the panel. The hole walls were drilled after which a thin layer 50 of electroless copper was applied to the panel to plate the hole wall. Following that step, a much thicker layer 52 of electrolytic copper was then plated on the panel to also cover the hole wall. Thus, the right sides of FIGS. 4 and 5 depict the copper plated thru-hole walls of panels drilled without the lubricating sheet and with the lubricating sheets, respectively. The plating steps illustrated in FIGS. 4 and 5 test the integrity of the drilled holes and their ability to produce proper electrical contact between the copper plating and the copper inner layers 40 and 42 and the outer layers 48. In the tests illustrated in FIGS. 4 and 5, the drills were run in a 3-high stack of panels, where two lubricating sheets were used in the stack of FIG. 5, above the upper panel and the second panel in the stack. In FIGS. 4 and 5, the lowermost panel in each stack was used in the photomicrograph samples. The photomicrograph data illustrate that the hole wall drilled using the lubricating sheets produced a hole wall of overall better quality by eliminating several defects that resulted when the lubricating sheets were not used. In the FIG. 4 example, in which the lubricating sheets were not used, epoxy smear is shown at 54, a nodule formed by a protruding fiber is shown at 56, slight nail heading (a widening of the copper inner layer) is shown at 58, and a burr is shown at 60 caused by exit of the drilling tool. These defects are not present in the photomicrograph illustrating the drill hole wall of FIG. 5. Moreover, the sample illustrated in FIG. 5 eliminated any of the commonly used chemical treatment following drilling inasmuch as the board was simply rinsed in an aqueous alkaline solution following the drilling step and prior to the copper plating steps.

FIGS. 6 and 7 illustrate photomicrograph test data taken from the cross sections of hole walls drilled in printed circuit board panels, in which FIG. 6 illustrates drilling without the lubricating sheets and FIG. 7 illustrates drilling with the lubricating sheets. In FIGS. 6 and 7, the entire cross sections of the panels are shown. These cross sections illustrate copper outer layers 62 and 64 at the top and bottom of the panel, copper inner layers 66 and 68 vertically spaced apart adjacent intervening epoxy-glass insulating layers 70, 72 and 74. The drill holes are shown on the left side of FIGS. 6 and 7, and in these examples, the drill holes were not plated following drilling. Both tests shown in FIGS. 6 and 7 were run on a 3-high stack of panels; and in FIG. 7, three lubricating sheets were inserted above the first, second and third panels in the stack. The cross sections of FIG. 6 and 7 also illustrate the lowermost of the three panels in each stack. The test results of FIG. 6 and 7 again illustrate the improved quality of the drill hole produced as a result of using the dry film lubricant sheet during the drilling process. The hole wall of FIG. 7 is essentially free of any defects, whereas a number of defects are shown in the example of FIG. 6. These defects include substantial nail heading shown at 76, an inner layer burr at 78, an exit burr at 80, and substantially more gouging or hole wall roughness at the region 82.

The following is a summary of the improvements resulting from the dry film lubricant drilling process of this invention.

1. Overall drill hole quality is improved by substantially reducing or eliminating protruding glass fibers, essentially eliminating dielectric smear, reducing nail heading of the inner layers and reducing or eliminating pink ring and other hole wall defects.

2. Drill life is increased substantially; and in one test, drill life was shown to be improved by 300%. This also increases the number of hits before removal or resharpening of the tool is required; and as a result, drilling production rate can be increased.

3. Drilling production also is increased, and is believed to be increased up to about 50%, because a greater number of stacked panels can be used in a single drilling operation.

4. The dry film lubricating sheet eliminates use of aggressive and hazardous smear removal chemicals such as sulfuric and chromic acids. These forms of chemical treatment produce further problems in the manufacturing process inasmuch as problems can develop during the electroless copper deposition process if previously used harsh chemicals are not completely neutralized. As a result of this invention, costly additional chemical treatment steps are eliminated, hole wall integrity and copper plating quality are improved, and environmental problems are eliminated.

What is claimed is:

1. A dry film lubricating sheet for use in a drilling process for lubricating a rotary drilling tool during the process of drilling a thru-hole in a printed circuit board in a dry state so that drill life is extended and the thru-holes are cleanly formed by preventing dielectric smear on the face of a metal layer through which the thru-hole is drilled, the lubricating sheet comprising a porous carrier sheet, and a lubricating material impregnated in and coating at least one surface of the carrier sheet in thin film form, the lubricating material comprising a mixture of a water soluble hardener comprising a principal component of the lubricating material, and a water soluble lubricant, combined to form a water soluble and substantially dry lubricating film in solid film form on the surface of the carrier sheet, so the film-coated carrier sheet comprises a separate lubricating sheet which can be overlaid on and removed from the surface of the printed circuit board, in which the lubricating film on the carrier sheet is in a film thickness sufficient to transfer lubricating properties to a rotary drill penetrating the overlaid carrier sheet, and in which the melting temperature of the dry film is lower than the drill tool temperature during normal use to liquify the film to transfer its lubricating properties from the lubricating sheet to the rotary drill.

2. A dry film lubricating sheet according to claim 1 in which the water soluble lubricating comprises glycol.

3. A dry film lubricating sheet according to claim 1 in which the water soluble hardener is a non-ionic surfactant.

4. A dry film lubricating sheet according to claim 2 in which the glycol is dipropylene glycol.

5. A dry film lubricating sheet according to claim 1 in which the film is impregnated in a water disolvable porous carrier sheet.

6. A dry film lubricating sheet according to claim 1 in which the dry lubricating film is dried to its solid state with the water soluable hardener contained in the film.

7. A dry film lubricating sheet according to claim 1 in which a clean thru-hole is produced using said dry lubricating film such that further acid treatment of the thru-hole to remove dialectric smear or to etch fibers protruding into the thru-hole is avoided in preparation for forming a conductive metal layer on the wall of the drilled thru-hole.

8. A dry film lubricating sheet according to claim 7 in which the sole means of treating the walls of the drilled thru-hole comprises rinsing the panel with an aqueous rinsing solution having a pH greater than about 7 following the drilling step and prior to forming a conductive metal layer on the surface of the drilled thru-hole.

9. A dry film lubricating sheet according to claim 1 in which a clean thru-hole is formed by drilling a printed circuit board panel having an epoxy-glass dielectic material.

10. A dry film lubricating sheet according to claim 1 in which use of the lubricating sheet in the drilling process extends drill life when compared with drilling the same panel without the dry lubricating film.

* * * * *